United States Patent
Liu et al.

(10) Patent No.: US 9,926,489 B2
(45) Date of Patent: Mar. 27, 2018

(54) FLUORESCENT POWDER AND LIGHT-EMITTING DEVICE INCLUDING THE SAME

(71) Applicants: General Research Institute for Nonferrous Metals, Beijing (CN); Grirem Advanced Materials Co., Ltd., Beijing (CN)

(72) Inventors: Ronghui Liu, Beijing (CN); Huibing Xu, Beijing (CN); Xiaofang Zhou, Beijing (CN); Chunlei Zhao, Beijing (CN); Qian Ma, Beijing (CN); Yuanhong Liu, Beijing (CN); Huaqiang He, Beijing (CN); Xiaowei Huang, Beijing (CN)

(73) Assignees: GENERAL RESEARCH INSTITUTE FOR NONFERROUS METALS, Beijing (CN); GRIREM ADVANCED MATERIALS CO., LTD., Beijing (CN)

( * ) Notice: Subject to any disclaimer, the term of this patent is extended or adjusted under 35 U.S.C. 154(b) by 207 days.

(21) Appl. No.: 14/900,198

(22) PCT Filed: Jun. 20, 2014

(86) PCT No.: PCT/CN2014/080435
§ 371 (c)(1),
(2) Date: Dec. 21, 2015

(87) PCT Pub. No.: WO2014/206250
PCT Pub. Date: Dec. 31, 2014

(65) Prior Publication Data
US 2016/0145489 A1    May 26, 2016

(30) Foreign Application Priority Data

| Jun. 24, 2013 | (CN) | 2013 1 0253675 |
| Jun. 24, 2013 | (CN) | 2013 1 0254331 |
| Dec. 3, 2013 | (CN) | 2013 1 0642643 |
| Dec. 3, 2013 | (CN) | 2013 1 0642659 |

(51) Int. Cl.
*C09K 11/64* (2006.01)
*H01L 33/00* (2010.01)
*C09K 11/77* (2006.01)
*C09K 11/08* (2006.01)
*H01L 33/50* (2010.01)

(52) U.S. Cl.
CPC ...... *C09K 11/7792* (2013.01); *C09K 11/0883* (2013.01); *C09K 11/7721* (2013.01); *C09K 11/7734* (2013.01); *C09K 11/7749* (2013.01); *C09K 11/7773* (2013.01); *C09K 11/7774* (2013.01); *H01L 33/504* (2013.01)

(58) Field of Classification Search
CPC ............ C09K 11/0883; C09K 11/7792; C09K 11/7721; C09K 11/7734; C09K 11/7749; H01L 33/502
See application file for complete search history.

(56) References Cited

U.S. PATENT DOCUMENTS

| 7,443,094 | B2 * | 10/2008 | Sakane | C09K 11/0883 |
| | | | | 252/301.4 F |
| 2011/0058582 | A1 * | 3/2011 | Fukuda | C09K 11/0883 |
| | | | | 372/44.01 |
| 2011/0058583 | A1 * | 3/2011 | Fukuda | C09K 11/0883 |
| | | | | 372/44.01 |
| 2012/0043569 | A1 | 2/2012 | Mitsuishi et al. | |
| 2012/0043573 | A1 | 2/2012 | Mitsuishi et al. | |

FOREIGN PATENT DOCUMENTS

| CN | 102763232 A | 10/2012 |
| WO | 2012111929 A2 | 8/2012 |

\* cited by examiner

*Primary Examiner* — C Melissa Koslow
(74) *Attorney, Agent, or Firm* — Shumaker, Loop & Kendrick, LLP; James D. Miller

(57) ABSTRACT

The present disclosure relates to a fluorescent powder and a light-emitting device including the same. The fluorescent powder includes an inorganic compound. The inorganic compound contains components including an element M, an element A, an element D, an element E, and an element R. The element M is selected from Eu, Ce, Mn, Tb, Dy, and Tm, the element A is selected from Mg, Ca, Sr, and Ba, the element D is selected from B, Al, Ga, In, La, Gd, Sc, Lu, and Y, the element E is selected from Si, Ge, Zr, and Hf, and the element R is at least two elements selected from N, O, F, and Cl. In a powder X-Ray Diffraction (XRD) spectrum with CoKα radiation, the inorganic compound at least has diffraction peaks within ranges of an Bragg angle (2θ) from 27.3° to 28.3°, 29.7° to 30.7°, 41.9° to 42.9°, and 43.5° to 44.5°.

24 Claims, 3 Drawing Sheets

FLUORESCENT POWDER AND LIGHT-EMITTING DEVICE INCLUDING THE SAME

CROSS-REFERENCES TO RELATED APPLICATIONS

This patent application is a United States national phase patent application based on PCT/CN2014/080435 filed on Jun. 20, 2014, which claims the benefit of Chinese Patent Application No. 201310642659.2 filed Dec. 3, 2013, Chinese Patent Application No. 201310642643.1 filed Dec. 3, 2013, Chinese Patent Application No. 201310253675.2 filed Jun. 24, 2013, and Chinese Patent Application No. 201310254331.3 filed Jun. 24, 2013. The disclosures of the above applications are hereby incorporated herein by reference in their entirety.

TECHNICAL FIELD

The present disclosure belongs to the field of inorganic light-emitting materials, particularly relating to a fluorescent powder and a Light-Emitting Device (LED) including the same.

BACKGROUND

As a new type of solid light sources, white light LEDs, with many advantages including high light efficiency, low energy consumption, long lifetime and no pollution and so on, have been widely applied in the field of illumination and display. At present, white light LEDs are mainly implemented by means of compound fluorescent powder with a single blue light/purple light chip. The solution is simple, easy and relatively cheap.

In the field of illumination, as an important indispensable component in the three primary colors of red, green and blue, the green fluorescent powder can be also matched with a blue light LED and red fluorescent powder to generate white lights in addition to the application in compensating the lack of green in "blue light LED+YAG:$Ce^{3+}$". It is important that the green fluorescent powder plays an extremely important role in improving the color rendering index of the white light LED. Moreover, during an implementation process of a liquid crystal backlight LED, a range of a color gamut of liquid crystal display is directly determined by a blue light chip, red fluorescent powder and green fluorescent powder. Therefore, the quality of green fluorescent powder has also become a key factor that influences the quality of liquid crystal display.

The emerging nitrogen/nitrogen oxide green fluorescent powder has attracted much attention since it came out, and its major component is a Sr—Al—Si—N—O compound activated by Eu ions or Ce ions, wherein the nitrogen/nitrogen oxide green fluorescent powder includes the following components: $MSi_2O_2N_2$: $Eu^{2+}$ (M=Ca, Sr, Ba), $M_3Si_6O_{12}N_2$:$Eu^{2+}$ (M=Ca,Sr,Ba), Ca-α-Sialon and β-Sialon green fluorescent powder and so on.

At present, green fluorescent powder needs to be further researched to provide more alternatives for the application of green fluorescent powder, and then to adapt to the rapid development of white light LEDs.

SUMMARY

The present disclosure aims to provide a fluorescent powder and a light-emitting device including the same so as to provide more alternatives for green fluorescent powder.

A fluorescent powder is provided according to an aspect of the present disclosure to achieve the purpose. The fluorescent powder contains an inorganic compound. The inorganic compound contains components including an element M, an element A, an element D, an element E, and an element R, wherein the element M is one or two elements selected from Eu, Ce, Mn, Tb, Dy, and Tm, the element A is one or two elements selected from Mg, Ca, Sr, and Ba, the element D is one or two elements selected from B, Al, Ga, In, La, Gd, Sc, Lu, and Y, the element E is one or two elements selected from Si, Ge, Zr, and Hf, and the element R is at least two elements selected from N, O, F, and Cl, and in a powder X-Ray Diffraction (XRD) spectrum with CoKα radiation, the inorganic compound at least has diffraction peaks within ranges of an Bragg angle (2θ) from 27.3° to 28.3°, 29.7° to 30.7°, 41.9° to 42.9°, and 43.5° to 44.5°, and phases having the diffraction peaks are main generation phases of the inorganic compound.

Further, the composition formula of the inorganic compound is $M_aA_bD_cE_dR_e$, wherein the parameters a, b, c, d and e satisfy the following conditions: 0.0001≤a≤0.5, 0.5≤b≤1.5, 0.5≤c≤1.5, 3≤d≤6 and 7≤e≤14.

Further, the inorganic compound has a crystal structure with a $P_m$ crystal system as a main phase.

Further, the parameters a, b, c, d, and e satisfy the following conditions: 0.03≤a≤0.1, 0.9≤b≤1.1, 0.9≤c≤1.1, 4.7≤d≤4.9 and 8≤e≤10.

Further, the parameters a, b, c and d satisfy the following condition: (a+b):c:d=(0.8-1.2):(0.8-1.2):(4.8-5.2).

Further, the parameters satisfy the following condition: d/c>4.6.

Further, the parameters satisfy the following condition: 4.7≤d/c≤4.9.

Further, lattice constants of the inorganic compound are a', b' and c' respectively, and values thereof are a'=14.74(1) Å, b'=9.036(1) Å and c'=7.461(1) Å.

Further, the element M includes Eu, the element A includes Sr, the element D includes Al, the element E includes Si, and the element R includes N and O.

Further, the ratio of the atomicity m of the element Sr to the atomicity b of the element A satisfies the following condition: 0.8≤m/b≤1.

Further, the element M is Eu, the element A is Sr, the element D is Al, the element E is Si, and the element R is N and O.

Further, the ratio of the atomicity n of the element N and the atomicity e of the element R satisfies the following condition: 0.5≤n/e<1.

Further, the ratio of the atomicity n of the element N and the atomicity e of the element R satisfies the following condition: 0.9≤n/e<1.

Further, the inorganic compound is irradiated by an excitation source to emit visible lights having peak wavelengths within a range of 510 nm to 550 nm.

Further, the fluorescent powder is a mixture formed by the inorganic compound and other crystal phases or non-crystal phases, and the other crystal phases and non-crystal phases account for less than 20% of the total mass of the mixture.

Further, in the powder XRD spectrum with CoKα radiation, the inorganic compound at least has diffraction peaks within ranges of an Bragg angle (2θ) from 17.4° to 18.4°, 27.3° to 28.3°, 29.7° to 30.7°, 41.9° to 42.9°, and 43.5° to 44.5°, and phases having the diffraction peaks are the main generation phases of the inorganic compound.

Further, in the powder XRD spectrum with CoKα radiation, the inorganic compound at least has diffraction peaks within ranges of an Bragg angle (2θ) from 17.4° to 18.4°, 27.3° to 28.3°, 29.7° to 30.7°, 35.6° to 36.6°, 37.0° to 38.0°, 41.9° to 42.9° and 43.5° to 44.5°, and phases having the diffraction peaks are the main generation phases of the inorganic compound;

Further, in the powder XRD spectrum with the CoKα radiation, the intensities of the diffraction peaks of the inorganic compound within the ranges of the Bragg angle (2θ) from 35.6° to 36.6° and 37.0° to 38.0° are higher than 10% of the intensity of the strongest diffraction peak in the diffraction spectrum and preferably 10% to 30% of the intensity of the strongest diffraction peak in the diffraction spectrum.

Further, in the powder XRD spectrum with the CoKα radiation, the intensity of the diffraction peak of the inorganic compound within the range of the Bragg angle (2θ) from 36.7° to 36.8° is not higher than 3% of the intensity of the strongest diffraction peak in the diffraction spectrum.

Further, in the powder XRD spectrum with CoKα radiation, the inorganic compound has diffraction peaks within ranges of an Bragg angle (2θ) from 17.4° to 18.4°, 27.3° to 28.3°, 29.7° to 30.7°, 31.0° to 32.0°, 34.0° to 35.0°, 35.6° to 36.6°, 37.0° to 38.0°, 41.9° to 42.9°, 43.5° to 44.5°, and phases having the diffraction peaks are the main generation phases of the inorganic compound.

Further, in the powder XRD spectrum with the CoKα radiation, the intensity of the diffraction peak of the inorganic compound within the range of the Bragg angle (2θ) from 31.0° to 32.0° is not higher than 5% of the intensity of the strongest diffraction peak in the diffraction spectrum.

Further, in the powder XRD spectrum with CoKα radiation, the inorganic compound at least has diffraction peaks within ranges of an Bragg angle (2θ) from 13.4° to 14.4°, 17.4° to 18.4°, 27.3° to 28.3°, 29.7° to 30.7°, 31.0° to 32.0°, 34.0° to 35.0°, 35.6° to 36.6°, 37.0° to 38.0°, 39.3° to 40.3°, 41.9° to 42.9°, 43.5° to 44.5°, 74.3° to 75.3°, and phases having the diffraction peaks are the main generation phases of the inorganic compound.

Further, in a powder XRD spectrum with CoKα radiation, the inorganic compound at least has diffraction peaks within ranges of an Bragg angle (2θ) from 13.4° to 14.4°, 15.1° to 16.1°, 17.4° to 18.4°, 23.7° to 25.7°, 27.3° to 28.3°, 29.7° to 30.7°, 31.0° to 32.0°, 34.0° to 35.0°, 35.6° to 36.6°, 37.0° to 38.0°, 39.3° to 40.3°, 41.9° to 42.9°, 43.5° to 44.5°, 46.5° to 47.5°, 54.6° to 55.6°, 74.3° to 75.3°, and phases having the diffraction peaks are the main generation phases of the inorganic compound.

An LED is provided according to another aspect of the present disclosure, including an excitation source and a luminophor, wherein the luminophor at least includes the above-mentioned fluorescent powder.

Further, the excitation source of the LED is an emission source of ultraviolet lights, purple lights, or blue lights.

The application of the technical solution in the present disclosure of a fluorescent powder and an LED including the same provides more alternatives for the application of green fluorescent powder, thus further promoting the rapid development of white light LEDs.

BRIEF DESCRIPTION OF THE DRAWINGS

The accompanying drawings of the specification, which constitute a part of the present application, are used for providing further understanding to the present disclosure. The exemplary embodiments of the present disclosure and the illustration thereof are used for explaining the present disclosure, instead of constituting an improper limitation to the present disclosure. In the accompanying drawings.

DETAILED DESCRIPTION OF THE EMBODIMENTS

Figure 1:
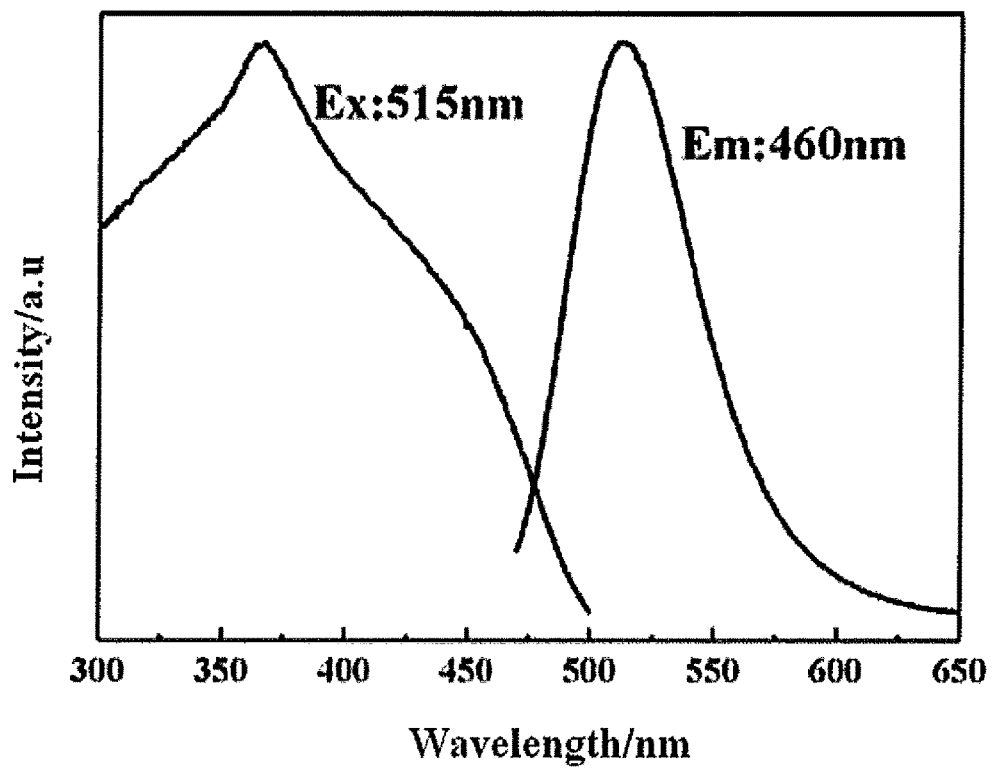
FIG. 1 shows the excitation spectrum and the emission spectrum of an inorganic compound prepared in the first embodiment.

It needs to be noted that the embodiments in the present application and the characteristics in the embodiments may be combined with each other if there is no conflict. The present disclosure will be expounded hereinafter with reference to the accompanying drawings and in combination with the embodiments.

As introduced in the background, green fluorescent powder needs to be further researched at present so as to provide more alternatives for the application of green fluorescent powder to further adapt to the rapid development of white light LEDs. Thus, the inventors of the present disclosure propose a fluorescent powder. The fluorescent powder contains an inorganic compound. The inorganic compound contains components including an element M, an element A, an element D, an element E, and an element R, wherein the element M is one or two elements selected from Eu, Ce, Mn, Tb, Dy, and Tm, the element A is one or two elements selected from Mg, Ca, Sr, and Ba, the element D is one or two elements selected from B, Al, Ga, In, La, Gd, Sc, Lu, and Y, the element E is one or two elements selected from Si, Ge, Zr, and Hf, and the element R is at least two elements selected from N, O, F, and Cl, and in a powder XRD spectrum with CoKα radiation, the inorganic compound at least has diffraction peaks within ranges of an Bragg angle (2θ) from 27.3° to 28.3°, 29.7° to 30.7°, 41.9° to 42.9°, and 43.5° to 44.5°, and phases having the diffraction peaks are main generation phases of the inorganic compound.

The fluorescent powder provided by the present disclosure can be irradiated by an excitation source to emit visible green lights having peak wavelengths within a range of 510 nm to 550 nm. The proposal of the green fluorescent powder provides more alternatives for the application of green fluorescent powder to further promote the rapid development of white light LEDs.

To further improve the relative brightness of the fluorescent powder, the composition formula of the inorganic compound is $M_aA_bD_cE_dR_e$ (wherein the element M is one or two elements selected from Eu, Ce, Mn, Tb, Dy, and Tm, the element A is one or two elements selected from Mg, Ca, Sr, and Ba, the element D is one or two elements selected from B, Al, Ga, In, La, Gd, Sc, Lu, and Y, the element E is one or two elements selected from Si, Ge, Zr, and Hf, and the element R is at least two elements selected from N, O, F, and Cl) in a preferred embodiment of the present disclosure, wherein the parameters a, b, c, d and e satisfy the following conditions: $0.0001 \le a \le 0.5$, $0.5 \le b \le 1.5$, $0.5 \le c \le 1.5$, $3 \le d \le 6$ and $7 \le e \le 14$.

In the composition formula of the inorganic compound, the element M, which functions as a light-emitting center, is one or two elements selected from Eu, Ce, Mn, Tb, Dy and Tm, and a represents the content of the element M. When the value of a is smaller than 0.0001, there are less light-emitting centers, thereby the brightness is low. When the value of a is larger than 0.5, there are too many ions of light-emitting centers, which shortens the distance between M ions and leads to concentration quenching, thereby resulting in extremely low brightness. Preferably, the brightness of the fluorescent powder is relatively high when $0.0001 \le a \le 0.5$, wherein M is preferably Eu, a preferred range of the value of a is $0.03 \le a \le 0.1$, and the fluorescent powder has better brightness at the moment.

In the composition formula of the inorganic compound, the element A is one or two elements selected from Mg, Ca, Sr and Ba. The element A and the element M occupy the same atomic location in the inorganic compound and b represents the content of the element A. Therefore, the value range of the element A is directly affected by the element M, and a preferred range of b is $0.5 \le b \le 1.5$, more preferably $0.9 \le b \le 1.1$.

In the composition formula of the inorganic compound, the element D is one or two elements selected from B, Al, Ga, In, La, Gd, Sc, Lu and Y, the element E is one or two elements selected from Si, Ge, Zr and Hf, the element R is at least two elements selected from N, O, F and Cl. In the inorganic compound, the element R may form a covalent bond with the element E, and the element R may also form a covalent bond with the element D simultaneously. These covalent bonds can improve the stability of the structure of the inorganic compound.

Preferably, in the composition formula of the inorganic compound, c represents the content of the element D, which is preferably $0.5 \le c \le 1.5$, more preferably $0.9 \le c \le 1.1$. When the content c of the element D is in this range, the inorganic compound is able to form more crystal phases beneficial to improve the brightness of the fluorescent powder, thus further improving the brightness of the inorganic compound.

Preferably, in the composition formula of the inorganic compound, d represents the content of the element E, which is preferably $3 \le d \le 6$, and more preferably, the content of the element E is $4.7 \le d \le 4.9$. When the content d of the element E is in this range, the inorganic compound is able to form more crystal phases beneficial to improve the brightness of the fluorescent powder, thus further improving the brightness of the inorganic compound.

Preferably, in the composition formula of the inorganic compound, e represents the content of the element R. Preferably, the value is in a range of $7 \le e \le 14$. When the value of the element R is N and O, a preferred range of the value is $8 \le e \le 10$. In this range, the inorganic compound is able to form more crystal phases beneficial to improve the brightness of the fluorescent powder, thus further improving the brightness of the inorganic compound.

In the fluorescent powder, the brightness of the obtained fluorescent powder is elaborated when the values of a, b, c, d and e are in different ranges. More preferably, the brightness of the fluorescent powder is relatively high when the values of a, b, c, d and e satisfy $0.03 \le a \le 0.1$, $0.9 \le b \le 1.1$, $0.9 \le c \le 1.1$, $4.7 \le d \le 4.9$, and $8 \le e \le 10$ simultaneously.

As a preferred embodiment of the present disclosure, it may be obtained through crystallographic structural analysis that the inorganic compound in the fluorescent powder is a crystal structure with a $P_m$ (the sixth space group of the International Tables for Crystallography) crystal system as a main phase.

Preferably, the parameters a, b, c, and d in the composition formula $M_a A_b D_c E_d R_e$ of the inorganic compound in the fluorescent powder satisfy the following condition: $(a+b):c:d=(0.8-1.2):(0.8-1.2):(4.8-5.2)$, thereby forming relatively stable network structures among elements in the inorganic compound obtained when the parameters a, b, c, and d satisfy the condition, and the inorganic compound has relatively high brightness and better stability.

Preferably, c and d in the composition formula $M_a A_b D_c E_d R_e$ of the inorganic compound in the fluorescent powder satisfy the following condition: $d/c>4.6$. At the moment, a crystal structure formed by the element D, the element D and the element R is relatively stable, and the inorganic compound has relatively high brightness, preferably $4.7 \le d/c \le 4.9$.

More preferably, lattice constants of the inorganic compound are a', b' and c' respectively, and values thereof are $a'=14.74(1)$ Å, $b'=9.036(1)$ Å and $c'=7.461(1)$ Å. The inorganic compound having such lattice constants is used as fluorescent powder with relatively high brightness and a relatively stable structure. The inorganic compound having the lattice constants includes, but is not limited to an inorganic compound having a molecular formula of $Eu_{0.05}Sr_{0.95}AlSi_{4.8}N_8O_{0.1}$.

Preferably, in the composition of the inorganic compound of the fluorescent powder, the element M includes Eu, the element A includes Sr, the element D includes Al, the element E includes Si, and the element R includes N and O. The inorganic compound having the elements is easier to form fluorescent powder with high brightness, wherein the element A further includes one or two elements of Mg, Ca and Ba besides Sr. The addition of the elements Mg, Ca and Ba can regulate an emission wavelength of the fluorescent powder. Preferably, the ratio of the atomicity m of the element Sr to the atomicity b of the element A satisfies the following condition: $0.8 \le m/b \le 1$. The brightness of the fluorescent powder can be improved in this range.

Preferably, in the composition of the inorganic compound of the fluorescent powder, the element M is Eu, the element A is Sr, the element D is Al, the element E is Si, and the element R is N and O. The inorganic compound formed by the elements is easier to form fluorescent powder with high brightness. Especially, a phosphor using an inorganic compound obtained when the element R is N and O as the host has excellent stability in high temperature air. More preferably, in the composition of the inorganic compound, the ratio of the atomicity n of the element N and the atomicity e of the element R satisfies the following condition: $0.5 \le n/e < 1$. In the case that the inorganic compound contains N and O simultaneously, the atomicity of N is increased to form a covalent bond structure with Al or/and Si atoms more easily. Such a covalent bond structure can be hardly damaged at a high temperature, thereby improving the stability of the fluorescent powder. Especially, the ratio of the atomicity n of the element N and the atomicity e of the element R preferably satisfies the following condition: $0.9 \le n/e < 1$. The fluorescent powder has higher stability at the moment.

In the inorganic compound of the fluorescent powder, the element M is preferably Eu as an activator. Of course, a coactivator may also be added and doped with the element M besides Eu. Ions of the coactivator may be one of Ce, Mn, Tb, Dy and Tm. The content of Eu in the element M is preferably larger than 80 mol % at the moment. Therefore, the inorganic compound is irradiated by an excitation source to emit visible lights having peak wavelengths within a range of 510 nm to 550 nm.

An ideal state from the perspective of fluorescence emission in the present disclosure is that the fluorescent powder includes are all crystal phases of the inorganic compound. However, other crystal phases or non-crystal phases different from the inorganic compound are inevitable during a practical synthesis process of the fluorescent powder, thus forming a mixture with the inorganic compound. In the case that the brightness does not attenuate evidently, the other crystal phases and non-crystal phases account for less than 20% of the total mass of the mixture (integration of the inorganic compound and the other crystal phases and non-crystal phases).

The existent of the diffraction peaks in the XRD spectrum has certain association with the generation phases in the inorganic compound. The diffraction peaks and the ratios of the peak intensities of the diffraction peaks in the ray diffraction spectrum are limited to further benefit to limit the varieties and the number of the generation phases in the inorganic compound, thus further optimizing the performance of the corresponding inorganic compound.

Preferably, in the powder XRD spectrum with CoKα radiation, the inorganic compound in the fluorescent powder at least has relatively high intensities of diffraction peaks within ranges of an Bragg angle (2θ) from 17.4° to 18.4°, 27.3° to 28.3°, 29.7° to 30.7°, 41.9° to 42.9°, and 43.5° to 44.5°, and phases having these diffraction peaks are main generation phases of the inorganic compound.

Preferably, in the powder XRD spectrum with CoKα radiation, the inorganic compound at least has relatively high intensities of diffraction peaks within ranges of an Bragg angle (2θ) from 17.4° to 18.4°, 27.3° to 28.3°, 29.7° to 30.7°, 35.6° to 36.6°, 37.0° to 38.0°, 41.9° to 42.9° and 43.5° to 44.5°, and phases having these diffraction peaks are main generation phases of the inorganic compound.

Preferably, in the powder XRD spectrum with the CoKα radiation, the intensities of the diffraction peaks of the inorganic compound within the ranges of the Bragg angle (2θ) from 35.6° to 36.6° and 37.0° to 38.0° are higher than 10% of the intensity of the strongest diffraction peak in the diffraction spectrum.

Preferably, in the powder XRD spectrum with the CoKα radiation, the intensity of the diffraction peak of the inorganic compound within the range of the Bragg angle (2θ) from 36.7° to 36.8° is not higher than 3% of the intensity of the strongest diffraction peak in the diffraction spectrum. It is indicated from the above that the diffraction peaks of the inorganic compound in the ranges of 35.6° to 36.6° and 37.0° to 38.0° are not crossed, which is indicated from another side that the inorganic compound is well crystallized.

Preferably, in a powder XRD spectrum with CoKα radiation, the inorganic compound has relatively high intensities of diffraction peaks within ranges of an Bragg angle (2θ) from 17.4° to 18.4°, 27.3° to 28.3°, 29.7° to 30.7°, 31.0° to 32.0°, 34.0° to 35.0°, 35.6° to 36.6°, 37.0° to 38.0°, 41.9° to 42.9°, 43.5° to 44.5°, and phases having the diffraction peaks are main generation phases of the inorganic compound.

Preferably, in the powder XRD spectrum with the CoKα radiation, the intensity of the diffraction peak of the inorganic compound within the range of the Bragg angle (2θ) from 31.0° to 32.0° is not higher than 5% of the intensity of the strongest diffraction peak in the diffraction spectrum.

Preferably, in the powder XRD spectrum with CoKα radiation, the inorganic compound at least has relatively high intensities of diffraction peaks within ranges of an Bragg angle (2θ) from 13.4° to 14.4°, 17.4° to 18.4°, 27.3° to 28.3°, 29.7° to 30.7°, 31.0° to 32.0°, 34.0° to 35.0°, 35.6° to 36.6°, 37.0° to 38.0°, 39.3° to 40.3°, 41.9° to 42.9°, 43.5° to 44.5°, 74.3° to 75.3°, and phases having the diffraction peaks are main generation phases of the inorganic compound.

Preferably, in the powder XRD spectrum with CoKα radiation, the inorganic compound at least has relatively high intensities of diffraction peaks within ranges of an Bragg angle (2θ) from 13.4° to 14.4°, 15.1° to 16.1°, 17.4° to 18.4°, 23.7° to 25.7°, 27.3° to 28.3°, 29.7° to 30.7°, 31.0° to 32.0°, 34.0° to 35.0°, 35.6° to 36.6°, 37.0° to 38.0°, 39.3° to 40.3°, 41.9° to 42.9°, 43.5° to 44.5°, 46.5° to 47.5°, 54.6° to 55.6°, 74.3° to 75.3°, and phases having the diffraction peaks are main generation phases of the inorganic compound.

The beneficial effect of fluorescent powder and an LED including the same of the present disclosure will be further described below in combination with embodiments 1-30.

Raw materials of inorganic compounds in embodiments 1-27 are as follows: a raw material of an M source may be one or more of a nitride, an oxide, a fluoride or a chloride of an element M; an A source is one or more of a nitride of an element A, a nitride, an oxide, a fluoride or a chloride of an element D, an E source is one or more of a nitride or an oxide of an element E, and an R source is provided by the fluorides, chlorides, oxides and nitrides of the element M, the element A, the element D and the element R, and nitrogen in a calcination atmosphere, and so on.

The preparation methods of the inorganic compounds in embodiments 1-27 are as follows: the raw materials are weighed accurately according to certain stoichiometric ratios, calcined in a nitrogen and/or hydrogen atmosphere at 1500 to 1800 degrees centigrade for 5 to 20 hours to obtain a calcination product which is subjected to a post-treatment to obtain a required inorganic compound. The post-treatment includes crushing, washing (water washing or weak acid washing and so on), and classification and so on.

Test 1

Measurement of emission spectrums (peak wavelength, full width at half maximum and relative brightness) of the inorganic compounds: the inorganic compounds represented in embodiments 1-27 are respectively excited by blue lights having a wavelength of 460 nm, and the test results are shown in Table 1.

Measurement of powder XRD spectrums with CoKα radiation: XRD is performed using a Co target (λ=1.78892 nm), and the test results are as shown in Table 2.

Embodiment 1

$Eu_2O_3$ is used as a Eu source, $Sr_3N_2$ is used as a Sr source, AlN is used as an Al source, and $\alpha$-$Si_3N_4$ is used as a Si source. Each raw material in the chemical formula $Eu_{0.05}Sr_{0.95}AlSi_{4.8}N_8O_{0.1}$ of an inorganic compound is weighed accurately according to proportions of the raw materials. The weighed raw materials are mixed uniformly. The mixed raw materials are incubated at 1750 degrees centigrade in a nitrogen atmosphere for 8 hours. The temperature is reduced to room temperature and then the mixed raw materials are taken out to obtain a required inorganic compound after post-treatment processes including grinding, washing and drying and so on. It is obtained through crystallographic structural analysis that the inorganic compound has a $P_m$ crystal structure, lattice constants thereof are a', b' and c', and values of the lattice constants are a'=14.74(1) Å, b'=9.036(1) Å and c'=7.461(1) Å.

Figure 2:
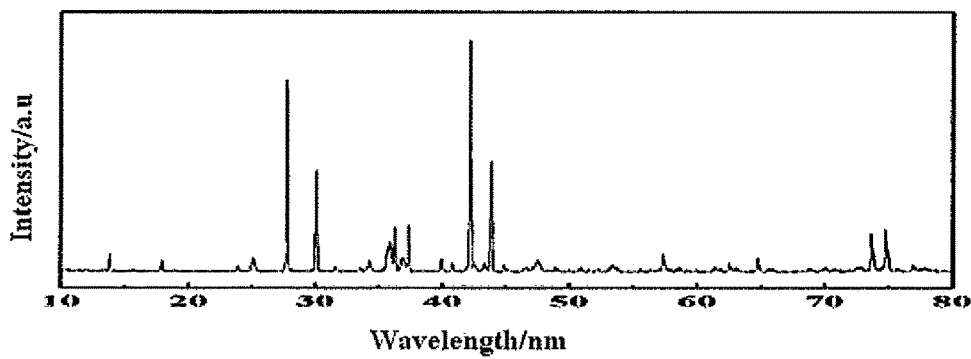
FIG. 2 shows the XRD spectrum of the inorganic compound prepared in the first embodiment.
Figure 3:
FIG. 3 shows the Scanning Electron Microscope (SEM) diagram of the inorganic compound prepared in the first embodiment.

FIG. 1 shows the emission spectrum and the excitation spectrum of the inorganic compound excited by blue lights with a wavelength of 460 nm. The peak wavelength of the inorganic compound is 515 nm, the full width at half maximum is 66.6 nm and the relative brightness is 131 (the relative brightness of the seventh embodiment countes as 100). The foregoing data are shown in Table 1 and an XRD spectrum is shown in FIG. 2. XRD-diffraction intensities are as shown in Table 2, and SEM data are shown in FIG. 3.

Embodiment 2

$Eu_2O_3$ is used as a Eu source, $Sr_3N_2$ is used as a Sr source, $Ca_3N_2$ is used as a Ca source, AlN is used as an Al source, and $\alpha$-$Si_3N_4$ is used as a Si source. Each raw material in the chemical formula $Eu_{0.05}Sr_{0.8}Ca_{0.15}Al_{1.1}Si_{4.7}N_{7.9}O_{0.2}$ of an inorganic compound are weighed accurately according to proportions of the raw materials. The weighed raw materials are mixed uniformly. The mixed raw materials are incubated at 1750 degrees centigrade in a nitrogen atmosphere for 8 hours. The temperature is reduced to room temperature and the mixed raw materials are taken out to obtain a required inorganic compound after post-treatment processes including grinding, washing and drying and so on. The inorganic compound has a $P_m$ crystal structure.

Figure 4:
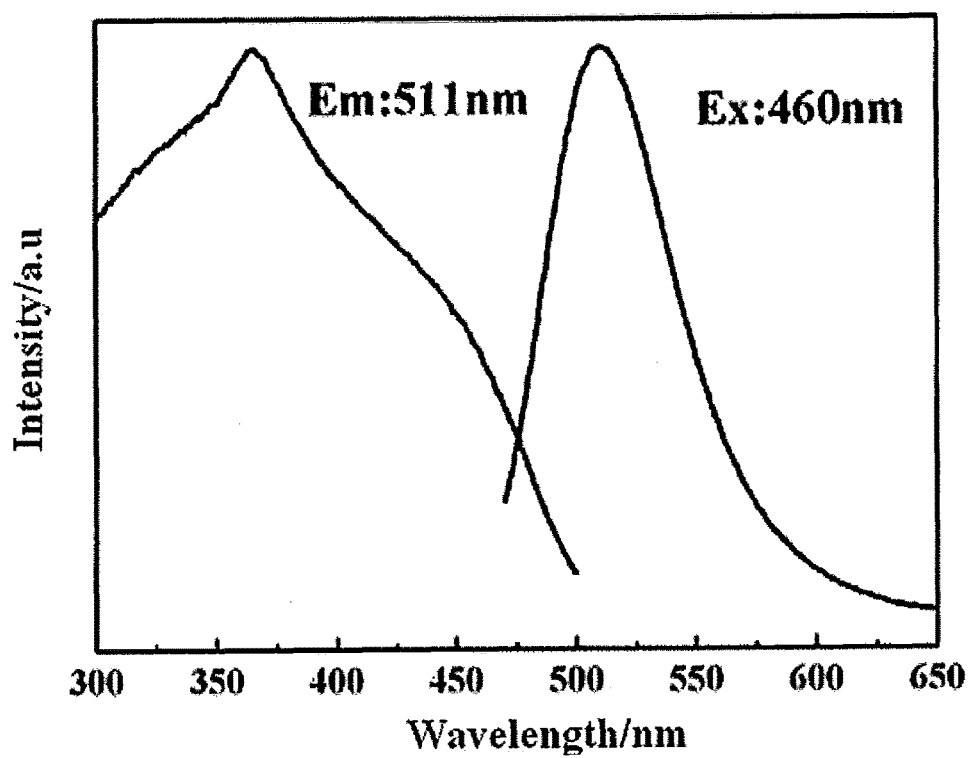
FIG. 4 shows the excitation spectrum and the emission spectrum of an inorganic compound prepared in the second embodiment.

FIG. 4 shows the emission spectrum and the excitation spectrum of the inorganic compound excited by blue lights with a wavelength of 460 nm. The peak wavelength of the inorganic compound is 511 nm, the full width at half maximum is 67.0 nm and the relative brightness is 108. The foregoing data are shown in Table 1 and XRD-diffraction intensities are shown in Table 2.

Embodiments 3-26

The preparation methods of the inorganic compounds in embodiments 3-26 are substantially similar to that in the first embodiment, except for selected raw materials and different proportions of the selected raw materials. All obtained inorganic compounds from embodiments 3-26 have a $P_m$ crystal structure. Parameters of photochromic properties of the obtained inorganic compounds are shown in Table 1and intensities of XRD diffraction peaks are shown in Table 2.

Embodiment 27

The preparation method of the inorganic compound in the twenty-seventh embodiment is substantially similar to that in the first embodiment, except for selected raw materials and different proportions of the selected raw materials. The obtained inorganic compound in the twenty-seventh embodiment has a $P_{222}$ crystal structure. Parameters of photochromic properties of the obtained inorganic compound are shown in

TABLE 1

Parameters of light-emitting performance of inorganic compounds represented in embodiments 1-27

| Embodiment | Chemical formula | Peak wavelength (nm) | Full width at half maximum (nm) | Relative brightness (%) |
|---|---|---|---|---|
| 1 | $Eu_{0.05}Sr_{0.95}AlSi_{4.8}N_8O_{0.1}$ | 514 | 66.6 | 131 |
| 2 | $Eu_{0.05}Sr_{0.8}Ca_{0.15}Al_{1.1}Si_{4.7}N_{7.9}O_{0.2}$ | 511 | 67.0 | 108 |
| 3 | $Eu_{0.04}Sr_1Al_{1.05}Si_{5.2}N_{8.4}O_{0.415}$ | 512 | 66.8 | 118 |
| 4 | $Eu_{0.1}Sr_{0.9}Al_{0.9}Si_{5.05}N_{7.7}O_{0.9}$ | 519 | 66.4 | 107 |
| 5 | $Eu_{0.06}Sr_{0.94}Al_{1.1}Si_{4.7}N_{7.9}O_{0.2}$ | 516 | 66.9 | 106 |
| 6 | $Eu_{0.001}Sr_{1.5}Al_{1.5}Si_{4.9}Na_{8.6}O_{0.651}$ | 504 | 66.8 | 97 |
| 7 | $Eu_{0.5}Sr_{0.5}Al_{1.2}Si_{4.9}N_{8.1}O_{0.45}$ | 524 | 67.0 | 100 |
| 8 | $Eu_{0.2}Sr_{0.92}Al_{0.5}Si_6N_{8.7}O_{0.82}$ | 521 | 66.9 | 105 |
| 9 | $Eu_{0.4}Sr_{1.4}Al_{1.5}Si_3N_{5.3}O_{2.1}$ | 532 | 80.2 | 101 |
| 10 | $Eu_{0.1}Sr_{1.3}AlSi_{4.95}N_{8.2}O_{0.5}$ | 519 | 66.8 | 109 |
| 11 | $Eu_{0.05}Sr_{0.76}Mg_{0.19}AlSi_{4.8}N_8O_{0.1}$ | 515 | 66.9 | 119 |
| 12 | $Eu_{0.02}Sr_{1.1}AlSi_{4.9}N_{8.1}O_{0.27}$ | 510 | 67.1 | 106 |
| 13 | $Eu_{0.05}Sr_{0.83}Ba_{0.12}AlSi_{4.9}N_{8.1}O_{0.15}$ | 516 | 67.1 | 116 |
| 14 | $Eu_{0.05}Sr_{0.88}Ba_{0.07}Al_{1.2}Si_{4.8}N_{8.2}O_{0.1}$ | 515 | 66.5 | 105 |
| 15 | $Eu_{0.05}Sr_{0.92}Ca_{0.03}AlSi_{4.9}N_{7.9}O_{0.45}$ | 515 | 66.7 | 127 |
| 16 | $Ce_{0.04}Sr_{0.94}AlSi_{4.8}N_8O_{0.1}$ | 542 | 102.2 | 116 |
| 17 | $Eu_{0.04}Mn_{0.02}Sr_{0.94}AlSi_{4.8}N_8O_{0.1}$ | 515 | 68.2 | 122 |
| 18 | $Tb_{0.04}Sr_{0.94}AlSi_{4.8}N_8F_{0.2}$ | 544 | 13.5 | 96 |
| 19 | $Eu_{0.03}Dy_{0.02}Sr_{0.94}AlSi_{4.8}N_8Cl_{0.2}$ | 516 | 69.1 | 109 |
| 20 | $Eu_{0.03}Tm_{0.02}Sr_{0.94}AlSi_{4.8}O_{11}Cl_{2.2}$ | 515 | 68.9 | 112 |
| 21 | $Eu_{0.06}Sr_{0.94}Al_{0.7}B_{0.3}Si_{4.9}N_8O_{0.3}$ | 517 | 69.4 | 117 |
| 22 | $Eu_{0.06}Sr_{0.94}Al_{0.8}Ga_{0.2}Si_{4.5}Ge_{0.4}N_8O_{0.3}$ | 515 | 67.4 | 113 |
| 23 | $Eu_{0.06}Sr_{0.94}Al_{0.9}In_{0.1}Si_{4.7}Zr_{0.2}N_8O_{0.3}$ | 515 | 67.1 | 111 |
| 24 | $Eu_{0.06}Sr_{0.94}Al_{0.85}La_{0.15}Si_{4.6}Ha_{0.3}N_8O_{0.3}$ | 516 | 67.0 | 109 |
| 25 | $Eu_{0.06}Sr_{0.94}Gd_{0.2}Lu_{0.8}Si_{4.9}N_8O_{0.3}$ | 515 | 66.5 | 104 |
| 26 | $Eu_{0.06}Sr_{0.94}Y_{0.9}Sc_{0.1}Si_{4.9}N_8O_{0.3}$ | 514 | 66.1 | 112 |
| 27 | $Eu_{0.06}Sr_{0.94}Al_{1.6}Si_{6.5}N_8O_{4.4}$ | 518 | 73.4 | 90 |

TABLE 2

XRD diffraction data represented in embodiments 1-27

| Embodiment | 13.4°~14.4° | 15.1°~16.1° | 17.4°~18.4° | 23.7°~25.7° | 27.3°~28.3° | 29.7°~30.7° | 31.0°~32.0° | 34.0°~35.0° |
|---|---|---|---|---|---|---|---|---|
| 1 | 7.4 | 0.3 | 4.6 | 2.2 | 82.7 | 43.9 | 2.1 | 4.4 |
| 2 | 2.2 | 0.3 | 6.2 | 4.3 | 23.8 | 100.0 | 0.7 | 5.0 |
| 3 | 5.0 | 0.3 | 3.1 | 3.9 | 67.0 | 100.0 | 1.7 | 5.9 |
| 4 | 5.2 | 0.4 | 5.5 | 1.8 | 79.1 | 38.4 | 2.2 | 2.4 |
| 5 | 6.5 | 0.3 | 7.8 | 3.7 | 100.0 | 83.2 | 1.0 | 9.8 |
| 6 | 3.2 | 0.5 | 4.9 | 1.9 | 33.1 | 100.0 | 2.4 | 4.2 |
| 7 | 2.6 | 3.8 | 3.4 | 4.7 | 46.9 | 53.8 | 1.4 | 3.2 |
| 8 | 3.5 | 0.3 | 4.8 | 13.3 | 37.9 | 55.3 | 1.3 | 3.2 |
| 9 | 0.6 | 11.2 | 0.9 | 27.0 | 1.5 | 4.3 | 0.9 | 0.4 |
| 10 | 0.9 | 0.3 | 0.6 | 11.0 | 7.6 | 64.3 | 0.6 | 18.0 |
| 11 | 0.8 | 0.3 | 5.2 | 8.8 | 33.1 | 100.0 | 0.8 | 6.6 |
| 12 | 5.7 | 0.4 | 5.8 | 2.8 | 84.9 | 69.8 | 1.7 | 4.4 |
| 13 | 2.1 | 0.6 | 4.4 | 3.6 | 45.6 | 100.0 | 0.3 | 7.1 |
| 14 | 1.3 | 0.4 | 7.1 | 5.7 | 67.6 | 100.0 | 0.2 | 7.8 |
| 15 | 0.8 | 0.2 | 8.9 | 7.9 | 22.8 | 100.0 | 0.6 | 13.0 |
| 16 | 2.4 | 0.3 | 6.7 | 6.9 | 100.0 | 54.6 | 1.5 | 8.3 |
| 17 | 3.3 | 0.3 | 5.5 | 10.2 | 100.0 | 67.1 | 1.2 | 10.4 |
| 18 | 3.5 | 0.4 | 4.7 | 19.0 | 67.7 | 100.0 | 1.5 | 6.7 |
| 19 | 2.6 | 0.3 | 4.5 | 5.4 | 77.2 | 100.0 | 2.1 | 7.6 |
| 20 | 3.1 | 0.4 | 6.6 | 6.1 | 45.1 | 100.0 | 0.6 | 5.6 |
| 21 | 2.8 | 0.2 | 11.2 | 7.7 | 65.2 | 100.0 | 1.2 | 6.8 |
| 22 | 0.7 | 0.3 | 2.3 | 6.7 | 100.0 | 45.1 | 1.4 | 7.1 |
| 23 | 2.6 | 0.3 | 9.8 | 9.2 | 100.0 | 65.2 | 0.9 | 10.5 |
| 24 | 1.3 | 0.5 | 8.4 | 4.5 | 56.7 | 100.0 | 0.6 | 11.2 |
| 25 | 2.9 | 0.4 | 3.2 | 6.6 | 45.7 | 100.0 | 1.2 | 9.0 |
| 26 | 4.4 | 0.3 | 2.7 | 8.1 | 66.2 | 100.0 | 1.0 | 7.8 |
| 27 | 3.6 | 29.5 | 4.3 | 10.5 | 77.3 | 100.0 | 7.4 | 24.6 |

| Embodiment | 35.6°~36.6° | 36.7°~36.8° | 37.0°~38.0° | 39.3°~40.3° | 41.9°~42.9° | 43.5°~44.5° | 46.5°~47.5° | 54.6°~55.6° | 74.3°~75.3° |
|---|---|---|---|---|---|---|---|---|---|
| 1 | 10.2 | 0.4 | 19.8 | 5.4 | 100.0 | 47.7 | 2.0 | 0.3 | 17.8 |
| 2 | 20.7 | 0.6 | 12.8 | 9.5 | 38.8 | 51.6 | 0.6 | 1.1 | 24.1 |
| 3 | 24.6 | 0.4 | 10.5 | 5.9 | 49.7 | 52.1 | 2.8 | 0.6 | 18.9 |
| 4 | 12.7 | 0.3 | 12.3 | 1.4 | 100.0 | 37.8 | 2.4 | 0.8 | 23.8 |
| 5 | 14.5 | 0.3 | 17.8 | 9.7 | 79.2 | 53.3 | 2.3 | 1.5 | 24.5 |
| 6 | 13.6 | 0.4 | 18.6 | 4.9 | 31.2 | 42.0 | 2.8 | 0.6 | 17.1 |
| 7 | 34.3 | 0.5 | 19.1 | 10.6 | 67.2 | 100.0 | 12.6 | 1.1 | 17.2 |
| 8 | 20.4 | 0.3 | 20.5 | 5.5 | 76.5 | 81.6 | 5.5 | 2.1 | 18.7 |
| 9 | 47.3 | 0.6 | 31.5 | 19.5 | 100.0 | 22.9 | 4.3 | 0.7 | 3.2 |
| 10 | 23.1 | 0.6 | 100.0 | 11.4 | 23.3 | 34.5 | 7.1 | 0.5 | 22.0 |
| 11 | 25.1 | 0.4 | 19.1 | 6.1 | 45.3 | 55.6 | 6.5 | 0.9 | 16.5 |
| 12 | 10.3 | 0.5 | 19.9 | 6.3 | 98.0 | 100.0 | 2.8 | 0.5 | 22.3 |
| 13 | 29.4 | 0.9 | 20.6 | 7.3 | 56.3 | 67.8 | 4.5 | 1.6 | 11.7 |
| 14 | 27.1 | 1.0 | 26.3 | 8.3 | 45.6 | 77.1 | 7.1 | 1.4 | 19.5 |
| 15 | 38.3 | 0.5 | 25.5 | 16.2 | 26.7 | 72.1 | 8.7 | 0.5 | 20.5 |
| 16 | 26.5 | 0.8 | 29.1 | 9.1 | 67.2 | 87.9 | 8.1 | 0.8 | 20.3 |
| 17 | 20.8 | 0.8 | 20.3 | 8.4 | 45.2 | 74.5 | 7.8 | 0.5 | 16.9 |
| 18 | 23.4 | 0.7 | 19.4 | 6.9 | 47.2 | 81.2 | 5.6 | 0.6 | 24.1 |
| 19 | 26.5 | 1.1 | 20.4 | 7.8 | 65.1 | 54.1 | 6.1 | 0.7 | 25.2 |
| 20 | 27.1 | 0.7 | 18.7 | 6.7 | 57.2 | 44.1 | 7.1 | 0.5 | 19.8 |
| 21 | 28.0 | 0.9 | 16.9 | 7.1 | 53.1 | 76.4 | 11.3 | 0.9 | 20.6 |
| 22 | 20.8 | 0.6 | 20.8 | 6.9 | 67.7 | 76.2 | 10.4 | 0.8 | 25.3 |
| 23 | 13.6 | 0.7 | 19.5 | 5.9 | 56.1 | 81.2 | 8.7 | 0.4 | 24.8 |
| 24 | 15.7 | 1.0 | 23.8 | 6.7 | 46.6 | 75.2 | 4.9 | 0.7 | 25.2 |
| 25 | 29.1 | 0.8 | 18.7 | 9.2 | 57.2 | 77.2 | 9.5 | 1.0 | 19.0 |
| 26 | 19.4 | 0.9 | 15.8 | 11.0 | 61.7 | 78.3 | 5.6 | 0.9 | 20.7 |
| 27 | 7.6 | 4.7 | 8.5 | 7.5 | 63.2 | 80.1 | 9.4 | 0.7 | 27.5 |

Test 2

Thermal stability test: the test is performed via a quantum efficiency device, and the quantum efficiency at different temperatures is tested at 460 nm excitation.

The fluorescent powder prepared by embodiments 1-27 of the present disclosure has good thermal stability to some extent. The thermal stability of the inorganic compounds prepared by the present disclosure will be described below in combination with test results of the inorganic compounds prepared by embodiments 1-27, silicate fluorescent powder (the formula is $Sr_{1.95}SiO_4$:0.05Eu) and β-Sialon fluorescent powder.

Figure 5:
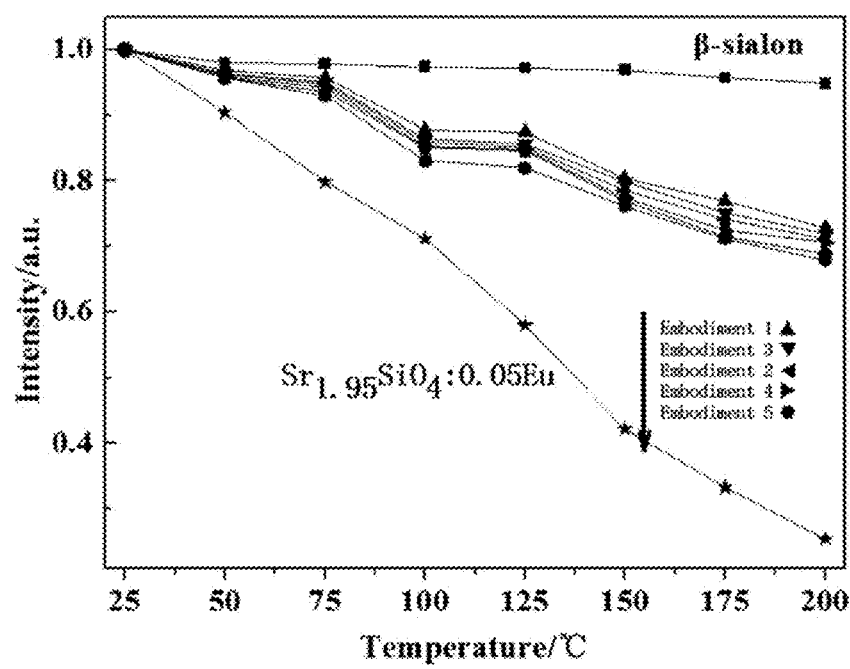
FIG. 5 shows comparison data among the thermal stability of inorganic compounds prepared in the first to the fifth embodiment, the silicate fluorescent powder, and the β-sialon fluorescent powder.
Figure 6:
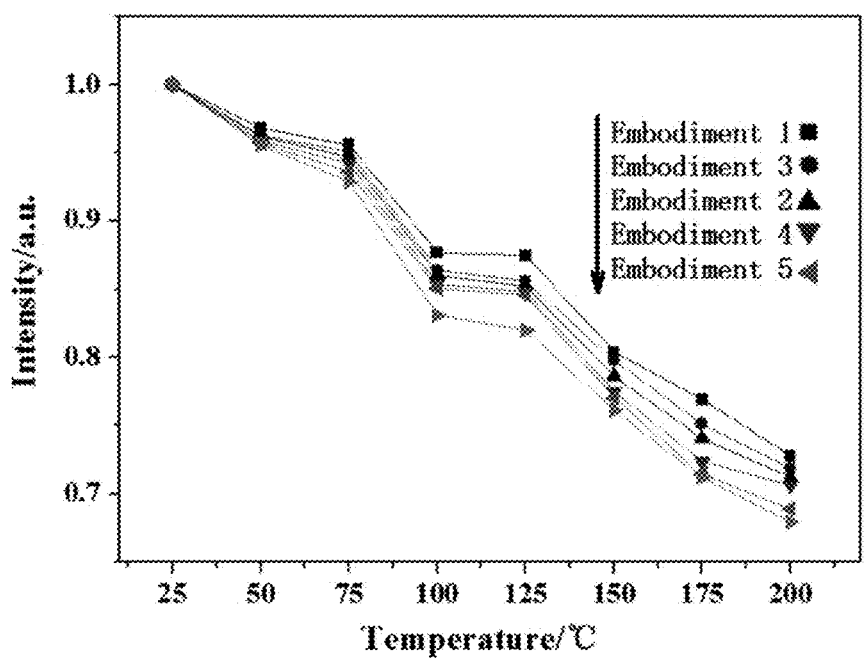
FIG. 6 is an enlarged representation of the data disclosed in FIG. 5 regarding the inorganic compounds prepared in the first to the fifth embodiment.

As shown in FIG. 5, FIG. 5 provides comparison data of the thermal stability among inorganic compounds prepared in embodiments 1-5, silicate fluorescent powder, and β-sialon fluorescent powder, wherein the thermal stability of the inorganic compounds prepared in embodiments 1-5 is better than that of the silicate fluorescent powder. In the five embodiments, the thermal stability is that embodiment 1>embodiment 3>embodiment 2>embodiment 4>embodiment 5.

The beneficial effect of applying the inorganic compounds prepared by the present disclosure as green fluorescent powder for a blue light LED chip will be further described below in combination with the t embodiments 28-30.

All the inorganic compounds provided by the present disclosure can be used as green fluorescent powder for a blue light LED chip. Description will be provided below by taking the first embodiment as an example in order to shorten the text length.

Embodiment 28

An LED uses a blue light LED chip, the nitrogen oxide green inorganic compound in the first embodiment and a red fluorescent substance CaAlSiN$_3$:Eu. The weight ratio of the former fluorescent substance to the latter fluorescent substance is green:red=80:20. The fluorescent substances are dispersed in silica gel having a refractive index of 1.41 and a transmittance of 99%. The chip is combined with a light conversion film, and circuits are welded and sealed to obtain a liquid crystal backlight module. For the liquid crystal backlight module, the light efficiency is 105 and the display color gamut is 100%.

Embodiment 29

An LED uses a blue light LED chip, the nitrogen oxide green inorganic compound in the second embodiment and a red fluorescent substance CaAlSiN$_3$:Eu. The weight ratio of the former fluorescent substance to the latter fluorescent substance is green:red=85:15. The fluorescent substances are dispersed in silica gel having a refractive index of 1.41 and a transmittance of 99%. The chip is combined with a light conversion film, and circuits are welded and sealed to obtain a liquid crystal backlight module. For the liquid crystal backlight module, the light efficiency is 103 and the display color gamut is 98%.

Embodiment 30

An LED uses a blue light LED chip, the nitrogen oxide green inorganic compound in the fifth embodiment and a red fluorescent substance CaAlSiN$_3$:Eu. The weight ratio of the former fluorescent substance to the latter fluorescent substance is green:red=75:25. The fluorescent substances are dispersed in silica gel having a refractive index of 1.41 and a transmittance of 99%. The chip is combined with a light conversion film, and circuits are welded and sealed to obtain a liquid crystal backlight module. For the liquid crystal backlight module, the light efficiency is 109 and the display color gamut is 102%.

The mentioned above is merely preferred embodiments of the present disclosure but is not to be construed as limitation to the protection scope of the present disclosure, and a variety of variations and modifications can be devised by those skilled in the art. Any modification, substitute and improvement made without departing from the spirit and scope of the present disclosure should all fall within the protection scope of the present disclosure.

What is claimed is:

1. A fluorescent powder, comprising an inorganic compound, wherein the inorganic compound contains components including an element M, an element A, an element D, an element E, and an element R, wherein the element M is one or two elements selected from Eu, Ce, Mn, Tb, Dy, and Tm, the element A is one or two elements selected from Mg, Ca, Sr, and Ba, and the element D is one or two elements selected from B, Al, Ga, In, La, Gd, Sc, Lu, and Y, the element E is one or two elements selected from Si, Ge, Zr, and Hf, and the element R is at least two elements selected from N, O, F, and Cl, and in a powder XRD spectrum with CoKα radiation, the inorganic compound at least has diffraction peaks within ranges of an Bragg angle 2θ from 27.3° to 28.3°, 29.7° to 30.7°, 41.9° to 42.9°, and 43.5° to 44.5°, and phases having the diffraction peaks are main generation phases of the inorganic compound;

wherein a composition formula of the inorganic compound is $M_aA_bD_cE_dR_e$, wherein parameters a, b, c, d and e satisfy the following conditions: 0.0001≤a≤0.5, 0.5≤b≤1.5, 0.5≤c≤1.5, 3≤d≤6 and 7≤e≤14;

wherein the inorganic compound has a crystal structure with a $P_m$ crystal system as a main phase.

2. The fluorescent powder according to claim 1, wherein the preferably, the parameters a, b, c, d, and e satisfy the following conditions: 0.03≤a≤0.1, 0.9≤b≤1.1, 0.9≤c≤1.1, 4.7≤d≤4.9 and 8≤e≤10.

3. The fluorescent powder according to claim 2, wherein the parameters a, b, c and d satisfy the following condition: (a+b):c:d=(0.8-1.2):(0.8-1.2):(4.8-5.2).

4. The fluorescent powder according to claim 2, wherein the parameters satisfy the following condition: d/c>4.6.

5. The fluorescent powder according to claim 4, wherein lattice constants of the inorganic compound are a', b' and c' respectively, and values thereof are a'=14.74(1) Å, b'=9.036(1) Å and c'=7.461(1) Å.

6. The fluorescent powder according to claim 2, wherein the element M includes Eu, the element A includes Sr, the element D includes Al, the element E includes Si, and the element R includes N and O.

7. The fluorescent powder according to claim 6, wherein a ratio of an atomicity m of the element Sr to an atomicity b of the element A satisfies the following condition: 0.8≤m/b≤1.

8. The fluorescent powder according to claim 6, wherein the element M is Eu, the element A is Sr, the element D is Al, the element E is Si, and the element R is N and O.

9. The fluorescent powder according to claim 8, wherein a ratio of an atomicity n of the element N and an atomicity e of the element R satisfies the following condition: 0.5≤n/e<1.

10. The fluorescent powder according to claim 8, wherein a ratio of the atomicity n of the element N and an atomicity e of the element R satisfies the following condition: 0.9≤n/e<1.

11. The fluorescent powder according to claim 2, wherein the parameters satisfy the following condition: 4.7≤d/c≤4.9.

12. The fluorescent powder according to claim 1, wherein the inorganic compound is irradiated by an excitation source to emit visible lights having peak wavelengths within a range of 510 nm to 550 nm.

13. The fluorescent powder according to claim 1, wherein the fluorescent powder is a mixture formed by the inorganic compound and other crystal phases or non-crystal phases, and the other crystal phases and non-crystal phases account for less than 20% of the total mass of the mixture.

14. The fluorescent powder according to claim 1, wherein in the powder XRD spectrum with CoKα radiation, the inorganic compound at least has diffraction peaks within ranges of an Bragg angle 2θ from 17.4° to 18.4°, 27.3° to 28.3°, 29.7° to 30.7°, 41.9° to 42.9°, and 43.5° to 44.5°, and phases having the diffraction peaks are the main generation phases of the inorganic compound.

15. The fluorescent powder according to claim 14, wherein in the powder XRD spectrum with CoKα radiation, the inorganic compound at least has diffraction peaks within ranges of a Bragg angle 2θ from 17.4° to 18.4°, 27.3° to 28.3°, 29.7° to 30.7°, 35.6° to 36.6°, 37.0° to 38.0°, 41.9° to 42.9° and 43.5° to 44.5°, and phases having the diffraction peaks are the main generation phases of the inorganic compound.

16. The fluorescent powder according to claim 15, wherein in the powder XRD spectrum with the CoKα radiation, intensities of the diffraction peaks of the inorganic compound within the ranges of the Bragg angle 2θ from 35.6° to 36.6° and 37.0° to 38.0° are higher than 10% of an intensity of a strongest diffraction peak in a diffraction spectrum.

17. The fluorescent powder according to claim 16, wherein in the powder XRD spectrum with the CoKα radiation, the intensities of the diffraction peaks of the inorganic compound within the ranges of the Bragg angle 2θ from 35.6° to 36.6° and 37.0° to 38.0° are higher than 10% to 30% of the intensity of the strongest diffraction peak in the diffraction spectrum.

18. The fluorescent powder according to claim 15, wherein in the powder XRD spectrum with the CoKα radiation, an intensity of the diffraction peak of the inorganic compound within the range of the Bragg angle 2θ from 36.7° to 36.8° is not higher than 3% of an intensity of a strongest diffraction peak in a diffraction spectrum.

19. The fluorescent powder according to claim 15, wherein in the powder XRD spectrum with CoKα radiation, the inorganic compound has diffraction peaks within ranges of an Bragg angle 2θ from 17.4° to 18.4°, 27.3° to 28.3°, 29.7° to 30.7°, 31.0° to 32.0°, 34.0° to 35.0°, 35.6° to 36.6°, 37.0° to 38.0°, 41.9° to 42.9°, 43.5° to 44.5°, and phases having the diffraction peaks are the main generation phases of the inorganic compound.

20. The fluorescent powder according to claim 19, wherein in the powder XRD spectrum with the CoKα radiation, an intensity of the diffraction peak of the inorganic compound within the range of the Bragg angle 2θ from 31.0° to 32.0° is not higher than 5% of an intensity of a strongest diffraction peak in a diffraction spectrum.

21. The fluorescent powder according to claim 19, wherein in the powder XRD spectrum with CoKα radiation, the inorganic compound at least has diffraction peaks within ranges of an Bragg angle 2θ from 13.4° to 14.4°, 17.4° to 18.4°, 27.3° to 28.3°, 29.7° to 30.7°, 31.0° to 32.0°, 34.0° to 35.0°, 35.6° to 36.6°, 37.0° to 38.0°, 39.3° to 40.3°, 41.9° to 42.9°, 43.5° to 44.5°, 74.3° to 75.3°, and phases having the diffraction peaks are the main generation phases of the inorganic compound.

22. The fluorescent powder according to claim 21, wherein in the powder XRD spectrum with CoKα radiation, the inorganic compound at least has diffraction peaks within ranges of an Bragg angle 2θ from 13.4° to 14.4°, 15.1° to 16.1°, 17.4° to 18.4°, 23.7° to 25.7°, 27.3° to 28.3°, 29.7° to 30.7°, 31.0° to 32.0°, 34.0° to 35.0°, 35.6° to 36.6°, 37.0° to 38.0°, 39.3° to 40.3°, 41.9° to 42.9°, 43.5° to 44.5°, 46.5° to 47.5°, 54.6° to 55.6°, 74.3° to 75.3°, and phases having the diffraction peaks are the main generation phases of the inorganic compound.

23. A light-emitting device including an excitation source and a luminophor, wherein the luminophor at least includes the fluorescent powder according to claim 1.

24. The light-emitting device according to claim 23, wherein the excitation source is an emission source of ultraviolet lights, purple lights, or blue lights.

\* \* \* \* \*